(12) United States Patent
Xu

(10) Patent No.: US 9,090,020 B2
(45) Date of Patent: Jul. 28, 2015

(54) PHOTO-CURABLE RESIN COMPOSITION

(71) Applicant: DSM IP ASSETS B.V., Heerlen (NL)

(72) Inventor: Jigeng Xu, South Elgin, IL (US)

(73) Assignee: DSM IP ASSETS B.V., Heerlen (NL)

( * ) Notice: Subject to any disclaimer, the term of this patent is extended or adjusted under 35 U.S.C. 154(b) by 0 days.

(21) Appl. No.: 14/078,975

(22) Filed: Nov. 13, 2013

(65) Prior Publication Data

US 2014/0093699 A1 Apr. 3, 2014

Related U.S. Application Data

(63) Continuation of application No. 11/589,746, filed on Oct. 31, 2006, now abandoned.

(51) Int. Cl.
| | | |
|---|---|---|
| *C08G 59/22* | (2006.01) | |
| *C08L 63/00* | (2006.01) | |
| *B29C 67/00* | (2006.01) | |
| *C08G 59/24* | (2006.01) | |
| *C08G 65/18* | (2006.01) | |
| *C08L 71/02* | (2006.01) | |
| *G03F 7/00* | (2006.01) | |
| *G03F 7/038* | (2006.01) | |
| *G03F 7/075* | (2006.01) | |
| *G03F 7/027* | (2006.01) | |

(52) U.S. Cl.
CPC .......... *B29C 67/0066* (2013.01); *C08G 59/22* (2013.01); *C08G 59/24* (2013.01); *C08G 65/18* (2013.01); *C08L 63/00* (2013.01); *C08L 71/02* (2013.01); *G03F 7/0037* (2013.01); *G03F 7/038* (2013.01); *G03F 7/0755* (2013.01); *G03F 7/027* (2013.01); *Y10T 428/24612* (2015.01)

(58) Field of Classification Search
CPC ........ C08G 59/22; C08G 59/24; C08G 65/18; C08L 63/00; C08L 71/02; C08L 2666/02; B29C 67/0066; G03F 7/038; G03F 7/0755; G03F 7/0037; G03F 7/027
USPC ............................ 428/172; 264/401; 522/170
See application file for complete search history.

(56) References Cited

U.S. PATENT DOCUMENTS

| | | |
|---|---|---|
| 3,708,296 A | 1/1973 | Schlesinger |
| 4,751,102 A | 6/1988 | Adair et al. |
| 4,772,530 A | 9/1988 | Gottschalk et al. |
| 4,772,541 A | 9/1988 | Gottschalk et al. |
| 5,002,856 A | 3/1991 | Anderson |
| 5,434,196 A | 7/1995 | Ohkawa et al. |
| 5,476,748 A | 12/1995 | Steinmann et al. |
| 5,525,645 A | 6/1996 | Ohkawa et al. |
| 5,667,937 A | 9/1997 | Lawton et al. |
| 5,674,922 A | 10/1997 | Igarashi et al. |
| 5,981,616 A | 11/1999 | Yamamura et al. |
| 6,127,085 A | 10/2000 | Yamamura et al. |
| 6,136,497 A | 10/2000 | Melisaris et al. |
| 6,368,769 B1 | 4/2002 | Ohkawa et al. |
| 6,379,866 B2 | 4/2002 | Lawton et al. |
| 6,413,696 B1 | 7/2002 | Pang et al. |
| 6,413,697 B1 | 7/2002 | Melisaris et al. |
| 6,855,748 B1 | 2/2005 | Hatton |
| 7,183,040 B2 | 2/2007 | Thies et al. |
| 7,232,850 B2 | 6/2007 | Johnson et al. |
| 7,307,123 B2 | 12/2007 | Johnson et al. |
| 2004/0137368 A1 | 7/2004 | Steinmann |
| 2004/0170923 A1 | 9/2004 | Steinmann et al. |
| 2005/0171228 A1 | 8/2005 | Hatton |
| 2005/0228064 A1 | 10/2005 | Johnson et al. |
| 2007/0054218 A1 | 3/2007 | Thommes et al. |
| 2007/0205528 A1 | 9/2007 | Patel et al. |
| 2008/0118666 A1 | 5/2008 | Thommes et al. |

FOREIGN PATENT DOCUMENTS

| | | |
|---|---|---|
| EP | 0 035 969 A1 | 9/1981 |
| EP | 0 035 969 B1 | 9/1981 |
| EP | 0 044 274 A2 | 1/1982 |
| EP | 0 044 274 B1 | 1/1982 |
| EP | 0 054 509 A2 | 6/1982 |
| EP | 0 054 509 B1 | 6/1982 |
| EP | 0 094 914 A2 | 11/1983 |
| EP | 0 094 915 A2 | 11/1983 |
| EP | 0 094 915 B1 | 11/1983 |
| EP | 0 153 904 B1 | 9/1985 |
| EP | 0 164 314 A2 | 12/1985 |
| EP | 0 164 314 B1 | 12/1985 |
| EP | 0 094 914 B1 | 11/1986 |
| EP | 0 223 587 B1 | 5/1987 |
| EP | 0 848 294 B1 | 6/1998 |
| EP | 1 371 695 A1 | 12/2003 |
| EP | 1 770 132 A1 | 4/2007 |
| WO | WO/98/28663 | 7/1998 |
| WO | 03/072625 A1 | 9/2003 |
| WO | 2005/054330 A1 | 6/2005 |
| WO | 2006/098676 A1 | 9/2006 |

OTHER PUBLICATIONS

International Search Report dated Jan. 25, 2008.

*Primary Examiner* — Nathan M Nutter
(74) *Attorney, Agent, or Firm* — Daniel S. Bujas

(57) ABSTRACT

The invention relates to a radiation curable composition comprising from about 50 wt % to about 70 wt % of a cycloaliphatic diepoxide, from about 5 wt % to about 15 wt % of a polyol, from about 5 wt % to about 15 wt % of an oxetane, from about 10 wt % to about 20 wt % of an aromatic diacrylate, a radical photoinitiator and a cationic photoinitiator. The invention further relates to a process for making a three dimensional article from the resin composition of the invention, to the three-dimensional article itself and to the use of the composition of the invention.

20 Claims, No Drawings

PHOTO-CURABLE RESIN COMPOSITION

This application is a continuation of U.S. patent application Ser. No. 11/589,746, filed Oct. 31, 2006, pending, the entire content of which are hereby incorporated by reference in this application.

FIELD OF THE INVENTION

The present invention relates to selected stereolithographic resins containing cationically curable and radically curable compounds.

BACKGROUND OF THE INVENTION

The production of three-dimensional articles of complex shape by means of stereolithography has been known for a number of years. In this technique the desired shaped article is built up from a radiation-curable composition with the aid of a recurring, alternating sequence of two steps (a) and (b). In step (a), a layer of the radiation-curable composition, one boundary of which is the surface of the composition, is cured with the aid of appropriate imaging radiation, preferably imaging radiation from a computer-controlled scanning laser beam, within a surface region which corresponds to the desired cross-sectional area of the shaped article to be formed, and in step (b) the cured layer is covered with a new layer of the radiation-curable composition, and the sequence of steps (a) and (b) is repeated until a so-called green model of the desired shape is finished. This green model is, in general, not yet fully cured and may therefore be subjected to post-curing, though such post curing is not required.

Via an equivalent process, photopolymer can be jetted by ink jet or multiple ink jet processes in an imagewise fashion. While jetting the photopolymer or after the photopolymer is applied, actinic exposure can be provided to initiate polymerization. Multiple materials (for example non-reactive waxes, weakly reacting photopolymers, photopolymers of various physical properties, photopolymers with various colors or color formers, etc.) can be jetted or applied to provide supports or alternate cured properties.

The mechanical strength of the green model (modulus of elasticity, fracture strength), also referred to as green strength, constitutes an important property of the green model and is determined essentially by the nature of the stereolithographic resin composition employed in combination with the type of stereolithography apparatus used and degree of exposure provided during part fabrication. Other important properties of a stereolithographic resin composition include a high sensitivity for the radiation employed in the course of curing and a minimum amount of curl or shrinkage deformation, permitting high shape definition of the green model. In addition, for example, it should be relatively easy to coat a new layer of the stereolithographic resin composition during the process. And of course, not only the green model but also the final cured article should have optimum mechanical properties.

The developments in this area of technology move towards compositions having better mechanical properties in order to better simulate properties of commodity materials like polypropylene and engineering type polymers. Also there exists a requirement for faster cure and process speeds, so as to decrease the time to build a part. This has resulted in new stereolithography machines having solid state lasers that have a high energy output, very fast laser-scanning and fast recoating processes. The new machines supply UV light with a power around 800 mW and above, compared to 200-300 mW for the older conventional machines. Also the scanning time is reduced by 3 to 4 times. These high powers, high scanning speeds, and short recoating times result in higher temperatures, due to polymerization exotherm of the resins and parts during fabrication. Typical temperatures have risen to values between 50° C. and 90° C., which leads to part distortion and excessive color development.

In order to achieve the desired balance of properties, different types of resin systems have been proposed. For example, radical-curable resin systems have been proposed. These systems generally consist of one or more (meth)acrylate compounds (or other free-radically polymerizable organic compounds) along with a free-radical photoinitiator for radical generation.

Another type of resin composition suitable for this purpose is a dual cure type system that comprises (i) epoxy resins or other types of cationically polymerizable compounds; (ii) cationic polymerization initiator; (iii) acrylate resins or other types of free-radically polymerizable compounds; and (iv) a free radical polymerization initiator.

Separately, oxetane compounds have been suggested as components for stereolithographic resins and other radiation-curable resins. They have been suggested as either a cationically polymerizing organic substance or as a reactive modifier component for such resins.

Several references teach the use of oxetane compounds in radiation curable resin compositions, including the following:

U.S. Pat. Nos. 5,434,196 and 5,525,645 (Ohkawa et al.) are directed to resin composition for optical molding which comprises (A) an actinic radiation-curable and cationically polymerizable organic substance and (B) an actinic radiation-sensitive initiator for cationic polymerization.

U.S. Pat. No. 5,674,922 (Igarashi et al.) teaches active energy beam-curable compositions which comprise (A) at least one oxetane compound (B) at least one epoxide compound and (C) at least one cationic initiator.

U.S. Pat. No. 5,981,616 (Yamamura et al.) teaches photo curable compositions that contain (A) an oxetane compound (B) one or more selected epoxy compounds and (C) a cationic photo-initiator.

U.S. Pat. No. 6,127,085 (Yamamura et al.) teaches a photo-curable composition comprising (A) a specific epoxy compound having a cyclohexane oxide; (B) a cationic photo-initiator; (C) a specific ethylenically unsaturated monomer; (D) a radical photo-initiator; and (E) a polyol.

U.S. Pat. No. 6,136,497 (Melisaris et al.) teaches a method for producing three-dimensional shaped articles with a radiation-curable composition containing (A) 20-90% by weight of cationically polymerizing compounds; (B) 0.05-12% by weight of cationic initiator; and (C) 0.5-60% by weight of at least selected cationic reactive modifiers.

U.S. Pat. No. 6,368,769 (Ohkawa et al.) teaches a stereolithographic resin composition that may include mixtures of the following: (A) cationically polymerizable organic substance that could be a mixture of an epoxy compound and an oxetane compound (3-ethyl-3-hydroxy methyloxetane is mentioned as an oxetane compound); (B) selected cationic photo-initiator; (C) radically polymerizable organic substance such as a polyacrylate; (D) radical photo-initiators; and (E) optional organic compounds having two or more hydroxyl groups per molecule (e.g., polyethers).

U.S. Pat. No. 6,379,866 (Lawton et al.) teaches a photo-sensitive composition comprising (A) 30-70% by weight of a cycloaliphatic diepoxide; (B) 5-35% by weight of an acrylic material selected from aromatic acrylic material or combinations thereof; (C) 10-39% by weight of an aliphatic polycarbonate diol or polytetrahydrofuran polyether polyol; (D) at least one cationic photoinitiator; and (E) at least one free-radical photoinitiator.

U.S. Pat. No. 6,413,696 (Pang et al.) teaches liquid, radiation-curable compositions that contain (A) 55-90% by weight of at least one solid or liquid actinic radiation-curable and cationically polymerizable organic substance (these may include oxetane compounds, see column 6, lines 42 to 54); (B) 0.05 to 10% by weight of an actinic radiation-sensitive initiator for cationic polymerization; (C) 5% to 25% by weight of an actinic radiation-curable and radical-polymerizable organic substance; (D) 0.02 to 10% by weight of an actinic radiation-sensitive initiator for radical polymerization; and (E) 0.5 to about 40 percent by weight of at least one solid or liquid cationically reactive modifier-flexibilizer, wherein the reactive modifier-flexibilizer is a reactive epoxy modifier, reactive vinylether modifier, reactive oxetane modifier, or mixtures thereof, and wherein the reactive modifier-flexibilizer contains at least one chain extension segment with a molecular weight of at least about 100 and not more than 2,000, wherein component (A) comprises at least one glycidylether of a polyhydric aliphatic, alicyclic or aromatic alcohol having at least three epoxy groups with epoxy equivalent weight between 90 and 800 g/equivalent and at least one solid or liquid alicyclic epoxide with epoxy equivalent weight between 80 and 330 having at least two epoxy groups with a monomer purity of at least about 80% by weight, or mixtures thereof.

European Patent No. 0848294 B (DSM N.V.; Japan Synthetic Rubber Col, LTD. and Japan Fiber Coatings, Ltd.) teaches a process for photo-fabricating a three-dimensional object by selectively curing a photo-curable composition comprising an (A) oxetane compound, (B) an epoxy compound and (C) a cationic photo-initiator wherein the oxetane compound (A) is either a compound comprising two or more oxetane rings or a specifically defined oxetane compound.

Japanese Published Patent Application (Kokai) No. 1-0158385 (Asahi. Denka Kogyo KK) teaches a resin composition for optically three-dimensional molding containing a cationic polymerizable organic material containing an oxetane ring in its molecule.

US 2004/0137368 (Steinmann) teaches a liquid radiation curable composition that comprises cationically polymerizable substances, radically polymerizable substances, a hydroxyl functional component and at least one hydroxyl-functional oxetane compound.

There exists a need for a liquid stereolithographic composition that possesses very high reactivity, high photo speed with green strength after cure, low viscosity, low humid sensitivity, and produces cured articles with high temperature resistance along with other mechanical and chemical properties desired in stereolithographic resins.

BRIEF SUMMARY OF THE INVENTION

The present invention relates to a radiation curable composition comprising:
a. from about 50 wt % to about 70 wt % of a cycloaliphatic diepoxide;
b. from about 5 wt % to about 15 wt % of a polyol;
c. from about 5 wt % to about 15 wt % of an oxetane;
d. from about 10 wt % to about 20 wt % of an aromatic diacrylate;
e. a radical photoinitiator; and
f. a cationic photoinitiator.

The present invention also relates to a radiation curable composition comprising:
a. from about 50 wt % to about 60 wt % of a cycloaliphatic diepoxide;
b. from about 10 wt % to about 15 wt % of a polytetramethylene glycol;
c. from about 7 wt % to about 10 wt % of a monofunctional oxetane having a hydroxyl group;
d. from about 10 wt % to about 20 wt % of an aromatic diacrylate;
e. from about 2 wt % to about 6 wt % of a radical photoinitiator;
f. from about 0.5 wt % to about 6 wt % of a cationic photoinitiator; and
g. from about 0.003 wt % to about 0.5 wt % of a photosensitizer.

The present invention further relates to a process for making a three-dimensional article comprising the steps of:
(1) coating a thin layer of the composition of the instant claimed invention onto a surface;
(2) exposing said thin layer imagewise to actinic radiation to form an imaged cross-section, wherein the radiation is of sufficient intensity and time to cause substantial curing of the thin layer in the exposed areas;
(3) coating a thin layer of the composition onto the previously exposed imaged cross-section;
(4) exposing said thin layer from step (3) imagewise to actinic radiation to form an additional imaged cross-section, wherein the radiation is of sufficient intensity and time to cause substantial curing of the thin layer in the exposed areas and to cause adhesion to the previously exposed imaged cross-section;
(5) repeating steps (3) and (4) a sufficient number of times in order to build up the three-dimensional article.

The present invention also relates to three-dimensional articles made from the resin composition of the present invention, or made by the process of the present invention.

The present invention also relates to the use of the instant claimed composition for making a three dimensional article.

DETAILED DESCRIPTION OF THE INVENTION

The instant claimed invention is a radiation-curable composition comprising:
a. from about 50 wt % to about 70 wt % of a cycloaliphatic diepoxide;
b, from about 5 wt % to about 15 wt % of a polyol;
c. from about 5 wt % to about 15 wt % of an oxetane;
d. from about 10 wt % to about 20 wt % of an aromatic diacrylate;
e. a radical photoinitiator; and
f. a cationic photoinitiator.

The resin composition of the present invention comprises at least one cycloaliphatic diepoxide. An epoxide is a compound that possesses at least one 1,2-epoxide group in the molecule. By "epoxide" is meant the three-membered ring having a structure represented by

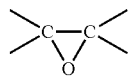

A cycloaliphatic diepoxide is a compound containing an aliphatic moiety having at least one cyclic structure and two 1,2-epoxide groups.

The epoxide-containing materials, also referred to as epoxy materials, are cationically curable, by which is meant that polymerization and/or crosslinking of the epoxy group may be initiated by cations.

Examples of compounds in which the epoxide groups are part of an cycloaliphatic ring system include bis(2,3-epoxycyclopentyl)ether; 2,3-epoxycyclopentyl glycidyl ether, 1,2-bis(2,3-epoxycyclopentyloxy)ethane; bis(4-hydroxycyclohexyl)methane diglycidyl ether, 2,2-bis(4-hydroxycyclohexyl)propane diglycidyl ether; 3,4-epoxycyclohexylmethyl-3',4'-epoxycyclohexanecarboxylate; 3,4-epoxy-6-methylcyclohexylmethyl-3,4-epoxy-6-methylcyclohexanecarboxylate; di(3,4-epoxycyclohexylmethyl)hexanedioate; di(3,4-epoxy-6-methylcyclo-hexylmethyl)hexanedioate; ethylenebis(3,4-epoxycyclohexane-carboxylate, ethanediol di(3,4-epoxycyclohexylmethyl)ether; vinylcyclohexene dioxide; dicyclopentadiene diepoxide or 2-(3,4-epoxycyclohexyl-5,5-spiro-3,4-epoxy-)cyclohexane-1,3-dioxane, and combinations thereof.

Preferred epoxy materials a) contain cycloaliphatic diepoxides. Especially preferred cycloaliphatic diepoxides are 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, 2-(3,4-epoxycyclohexyl-5,5-spiro-3,4-epoxy)cyclohexane-1,3-dioxane, and combinations thereof.

The preferred cycloaliphatic diepoxide is 3,4-epoxycyclohexylmethyl-3',4'-epoxy-cyclohexanecarboxylate which is available as Cyracure UVR 6105 or 6110.

The amount of the cycloaliphatic diepoxide is from about 50 wt % to about 70 wt %, relative to the total weight of the composition. Preferably the amount is from about 50 wt % to about 60 wt %, relative to the total weight of the composition.

The composition of the invention may contain other epoxy-group-containing compounds. Examples of suitable epoxy materials include polyglycidyl and poly(methylglycidyl) esters of aromatic polycarboxylic acids, or poly(oxiranyl) ethers of polyethers; polyglycidyl or poly(methylglycidyl) ethers obtainable by the reaction of a compound having at least one free alcoholic hydroxy group and/or phenolic hydroxy group and a suitably substituted epichlorohydrin. The alcohols can be acyclic alcohols, such as, for example, C2-C30 alkanols, alkoxylated alcohols, polyols such as for example 1,4-butanediol, trimethylol propane, neopentylglycol, dibromo neopentyl glycol, ethylene glycol, diethylene glycol, and higher poly(oxyethylene)glycols; cycloaliphatic, such as, for example, 1,3- or 1,4-dihydroxycyclohexane, cyclohexane dimethanol, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane; Other suitable epoxy compounds include those which may be derived from mono nuclear phenols, such as, for example, resorcinol or hydroquinone, or they may be based on polynuclear phenols, such as, for example, bis(4-hydroxyphenyl)methane (bisphenol F), bis(4-hydroxyphenyl)S (Bisphenol S), 2,2-bis(4-hydroxyphenyl)propane (bisphenol A), alkoxylated bisphenol A, F or S, triol extended bisphenols A, F or S, and brominated bisphenols A, F or S; glycidyl ethers of phenols and phenols with pendant groups and chains; or on condensation products, obtainable under acidic conditions, of phenols or cresols with formaldehyde, such as phenol novolacs and cresol novolacs, as well as dicyclopentadiene backbone phenol glycidyl ethers and tris(hydroxyphenyl) methane-based epoxies.

The composition comprises as component b) a polyol. A polyol is an organic molecule having at least 2 hydroxy groups. The polyol may be monomeric or polymeric.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(−)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

It is preferred that the polyol is an aliphatic polyol.

Representative examples of useful oligomeric and polymeric hydroxyl-containing materials include polyoxyethylene and polyoxypropylene glycols and triols of number average molecular weight from about 200 to about 10,000; polytetramethylene glycols of varying number average molecular weights; poly(oxyethylene-oxybutylene) random or block copolymers; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

Preferred hydroxyl-containing monomers include 1,4-cyclohexanedimethanol and aliphatic and cycloaliphatic monohydroxy alkanols. Preferred hydroxyl-containing oligomers and polymers include hydroxyl and hydroxyl/epoxy functionalized polybutadiene, polycaprolactone diols and trials, ethylene/butylene polyols, and monohydroxyl functional monomers. Preferred examples of polyether polyols are polypropylene glycols of various number average molecular weights and glycerol propoxylate-B-ethoxylate triol.

Especially preferred are polyols selected from polyoxyethylene, polyoxypropylene or polytetramethylene glycol of number average molecular weight from about 600 to about 2000.

The composition preferably comprises, relative to the total weight of the composition, from about 5 wt % to about 15 wt %, more preferably from about 10 wt % to about 15 wt % of a polyol.

The composition of the present invention comprises as component c) an oxetane.

The resin compositions of the present invention may be advantageously employed in high powered stereolithography machines having solid state lasers. The presence of oxetanes improves the flexibility of the objects made from the composition. Furthermore it has been surprisingly found that the presence of oxetanes gives a higher accuracy of object formation, less curling and deformation during the build of the part. It has also been unexpectedly found that the green strength of the parts increases significantly when oxetanes are present in the composition in ranges from about 5 wt % to about 15 wt %, preferably from about 7 wt % to about 10 wt %, relative to the total weight of the composition.

An oxetane compound comprises at least one oxetane ring shown by the following formula (1).

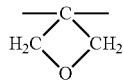
(1)

The oxetane compound can be polymerized or crosslinked by irradiation with light in the presence of a cationic photoinitiator. The oxetane, or oxetane compound, may comprise one or more oxetane rings.

Examples of oxetanes having one oxetane ring in the molecule, are shown by the following formula (2):

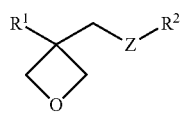
(2)

wherein Z represents an oxygen atom or sulphur atom; $R^1$ represents a hydrogen atom, fluorine atom, an alkyl group having 1-6 carbon atoms such as a methyl group, ethyl group, propyl group, and butyl group, a fluoroalkyl group having 1-6 carbon atoms such as trifluoromethyl group, perfluoroethyl group, and perfluoropropyl group, an aryl group having 6-18 carbon atoms such as a phenyl group and naphthyl group, a furyl group, or a thienyl group; and $R^2$ represents a hydrogen atom, an alkyl group having 1-6 carbon atoms for example a methyl group, ethyl group, propyl group, and butyl group, an alkenyl group having 2-6 carbon atoms for example a 1-propenyl group, 2-propenyl group, 2-methyl-1-propenyl group, 2-methyl-2-propenyl group, 1-butenyl group, 2-butenyl group, and 3-butenyl group, an aryl group having 6-18 carbon atoms for example a phenyl group, naphthyl group, anthranyl group, and phenanthryl group, a substituted or unsubstituted aralkyl group having 7-18 carbon atoms for example a benzyl group, fluorobenzyl group, methoxy benzyl group, phenethyl group, styryl group, cynnamyl group, ethoxybenzyl group, a group having other aromatic rings for instance an aryloxyalkyl for example a phenoxymethyl group and phenoxyethyl group, an alkylcarbonyl group having 2-6 carbon atoms for example an ethylcarbonyl group, propylcarbonyl group, butylcarbonyl group, an alkoxy carbonyl group having 2-6 carbon atoms for example an ethoxycarbonyl group, propoxycarbonyl group, butoxycarbonyl group, an N-alkylcarbamoyl group having 2-6 carbon atoms such as an ethylcarbamoyl group, propylcarbamoyl group, butylcarbamoyl group, pentylcarbamoyl group, or a polyether group having 2-1000 carbon atoms.

Examples of oxetane compounds having two oxetane rings in the molecule are compounds shown by the following formula (3):

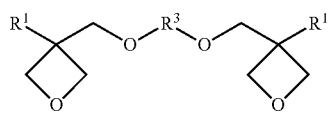
(3)

wherein $R^1$ is the same as defined for the above formula (2); $R^3$ represents a linear or branched alkylene group having 1-20 carbon atoms for example an ethylene group, propylene group, and butylene group, a linear or branched poly(alkyleneoxy) group having 1-120 carbon atoms for example a poly(ethyleneoxy) group and poly(propyleneoxy) group, a linear or branched unsaturated hydrocarbon group for example a propenylene group, methylpropenylene group, and butenylene group; and $R^3$ may be a polyvalent group selected from groups shown by the following formulas (4), (5), and (6):

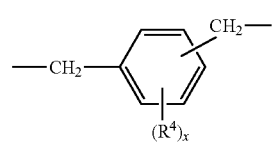
(4)

wherein $R^4$ represents an alkyl group having 1-4 carbon atoms, an alkoxy group having 1-4 carbon atoms, a halogen atom for example a chlorine atom or bromine atom, a nitro group, cyano group, mercapto group, carboxyl group, or carbamoyl group, and x is an integer from 0-4;

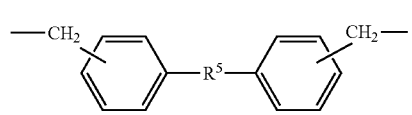
(5)

wherein $R^5$ represents an oxygen atom, sulphur atom, methylene group, —NH—, —SO—, —SO2-, —C(CF$_3$)$_2$—, or —C(CH$_3$)$_2$—;

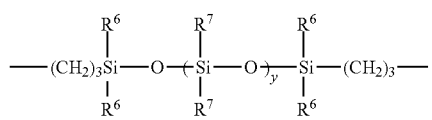
(6)

wherein $R^6$ represents an alkyl group having 1-4 carbon atoms or an aryl group having 6-18 carbon atoms for example a phenyl group or naphthyl group, y is an integer from 0-200, and $R^7$ represents an alkyl group having 1-4 carbon atoms, an aryl group having 6-18 carbon atoms for example a phenyl group or naphthyl group, or a group shown by the following formula (7):

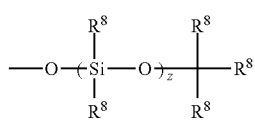
(7)

wherein $R^8$ represents an alkyl group having 1-4 carbon atoms or an aryl group having 6-18 carbon atoms for example a phenyl group or naphthyl group, and z is an integer from 0 to 100.

In this patent application, there is no formula (8). The next three formulas are (9), (10) and (11).

Specific examples of the compounds having two oxetane rings in the molecule are compounds shown by the following formulas (9), and (10).

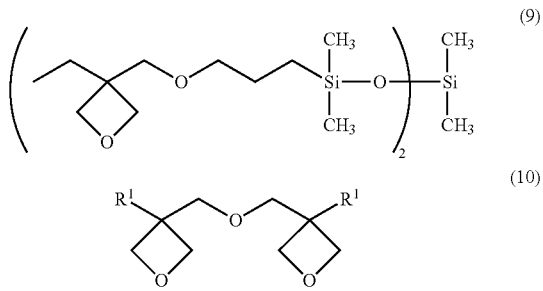

(9)

(10)

In the formula (10), R¹ is the same as defined for the above formula (2).

Examples of the compounds having three or more oxetane rings in the molecule are compounds represented by formula (11):

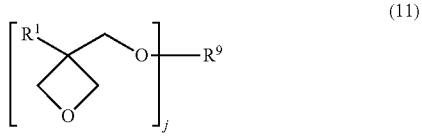

(11)

wherein R¹ is the same as defined for the above formula (2); R⁹ represents an organic group with a valence of 3-10.

In this patent application, there is no formula (12), (13), (14), (15), (16) or (17). The next formulas are (18), (19) and (20), (21) and (22).

Specific examples of compounds having three or more oxetane rings in the molecule are compounds shown by the following formula (18):

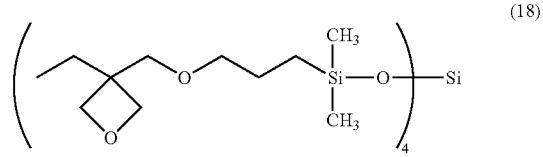

(18)

Compounds shown by the following formula (19) may comprise 1-10 oxetane rings:

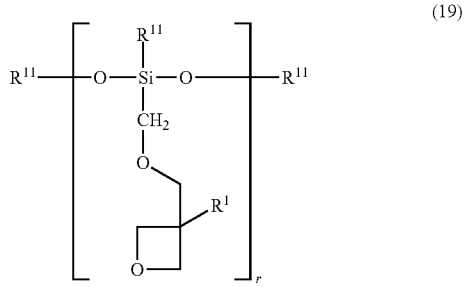

(19)

wherein R¹ is the same as defined for the formula (2), R⁸ is the same as defined for the formula (7), R¹¹ represents an alkyl group having 1-4 carbon atoms or trialkylsilyl group (wherein each alkyl group individually is an alkyl group having 1-12 carbon atom), for example a trimethylsilyl group, triethylsilyl group, tripropylsilyl group, or tributylsilyl group, and r is an integer from 1-10.

Furthermore, other than the above-mentioned compounds, compounds having a polystyrene-reduced number average molecular weight measured by gel permeation chromatography of from about 1,000 to about 5,000 can be given as examples of the oxetane compound c). Examples of such compounds are compounds shown by the following formulas (20), (21), and (22):

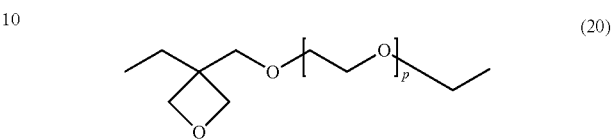

(20)

wherein p is an integer from 20-200:

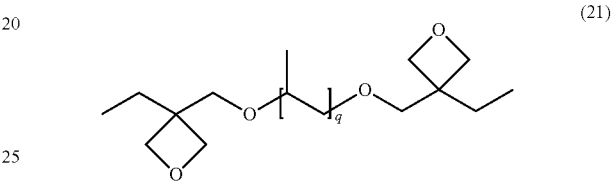

(21)

wherein q is an integer from 15-100:

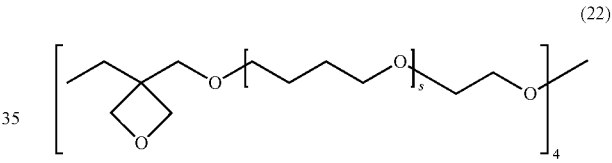

(22)

wherein s is an integer from 20-200.

Specific examples of the above-described oxetane compounds are given below:

Compounds containing one oxetane ring in the molecule are: 3-ethyl-3-hydroxymethyloxetane, 3-(meth)allyloxymethyl-3-ethyloxetane, (3-ethyl-3-oxetanylmethoxy)methylbenzene, (3-ethyl-3-oxetanylmethoxy)benzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl)ether, 2-ethylhexyl(3-ethyl-3-oxetanyl methyl)ether, ethyldiethylene glycol (3-ethyl-3-oxetanylmethyl) ether, dicyclopentadiene (3-ethyl-3-oxetanylmethyl)ether, dicyclopentenyloxyethyl(3-ethyl-3-oxetanyl methyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanyl methyl)ether, 2-hydroxypropyl(3-ethyl-3-oxetanylmethyl) ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl)ether.

Compounds containing two or more oxetane rings in the molecule: 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis (3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl) ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F (3-ethyl-3-oxetanylmethyl)ether. These compounds can be used either individually or in combination of two or more.

Preferred oxetanes are selected from the group consisting of components defined by formula 2, wherein $R^1$ is a C1-C4 alkyl group, Z=Oxygen and $R^2$=H, a C1-C8 alkyl group or a phenyl group; 3-ethyl-3-hydroxymethyloxetane, (3-ethyl-3-oxetanylmethoxy)methylbenzene, (3-ethyl-3-oxetanylmethoxy)benzene, 2-ethylhexyl(3-ethyl-3-oxetanyl methyl) ether, 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether and bis(3-ethyl-3-oxetanylmethyl)ether.

In one embodiment of the present invention, the preferred oxetane is a monofunctional oxetane having an OH group.

The oxetane compounds can be used either individually or in combinations of two or more.

The composition of the present invention further comprises as component d) an aromatic diacrylate.

Examples of suitable aromatic diacrylates are bisphenol A di(meth)acrylate, bisphenol F di(meth)acrylate, bisphenol S di(meth)acrylate, EO-modified bisphenol A di(meth)acrylate, PO-modified bisphenol A di(meth)acrylate, EO-modified bisphenol F di(meth)acrylate, PO-modified bisphenol F di(meth)acrylate, EO-modified bisphenol S di(meth)acrylate, PO-modified bisphenol S di(meth)acrylate.

In one embodiment, the composition comprises from about 5 wt % to about 25 wt % of the aromatic diacrylate, relative to the total weight of the composition. In another embodiment, the composition comprises from about 10 wt % to about 20 wt % of the aromatic diacrylate, relative to the total weight of the composition.

The composition of the present invention contains one or more free radical photoinitiators e).

Examples of photoinitiators include benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethyl anthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin TPO), benzophenones, such as benzophenone, dimethoxybenzophenone, diphenoxybenzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl(1-hydroxyisopropyl)ketone and 4-isopropylphenyl(1-hydroxyisopropyl)ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds.

Suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, benzophenone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541, which are hereby incorporated by reference in their entirety.

Examples of suitable ionic dye-counter ion compounds are anionic dye-iodonium ion complexes, anionic dye-pyryllium ion complexes and, especially, cationic dye-borate anion compounds of the following formula (23)

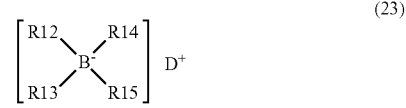

(23)

wherein $D^+$ is a cationic dye and $R_{12}$, $R_{13}$, $R_{14}$, and $R_{15}$ are each independently of the others alkyl, aryl, alkaryl, allyl, aralkyl, alkenyl, alkynyl, an alicyclic or saturated or unsaturated heterocyclic group. Preferred definitions for the radicals R_{12} to R_{15} can be found, for example, in published European patent application EP 223587, which is herein incorporated in its entirety by reference.

Preferred free radical photoinitiators include 1-hydroxycyclohexyl phenyl ketone, 2-hydroxy-2-methyl-1-phenylpropan-1-one, 2,2-dimethoxyacetophenone, benzophenone and 2,4,6-trimethylbenzoyldiphenylphosphine oxide. These photoinitiators alone or in combination with each other tend to be comparatively less yellowing.

The present composition comprises, relative to the total weight of the composition, from about 0.1 wt % to about 15 wt % of one or more free radical photoinitiators. In one embodiment, the present composition comprises, relative to the total weight of the composition, from about 1 wt % to about 10 wt % of one or more free radical photoinitiators, relative to the total weight of the composition. In another embodiment, the present composition comprises, relative to the total weight of the composition, from about 2 wt % to about 6 wt % of one or more free radical photoinitiators.

In the compositions according to the invention, any suitable type of photoinitiator that, upon exposure to actinic radiation, forms cations that initiate the reactions of the cationically polymerizable compounds, such as epoxy material(s), can be used as component f).

There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring).

Preferred initiators include diaryl iodonium salts, triaryl sulfonium salts, or the like. Typical photo-polymerization initiators are represented by the following formulae (24) and (25):

(24)

$MZ^-_{t+1}$

(25)

$MZ^-_{t+1}$ wherein
$Q_3$ represents a hydrogen atom, an alkyl group having 1 to 18 carbon atoms, or an alkoxyl group having 1 to 18 carbon atoms;
M represents a metal atom, preferably antimony;
Z represents a halogen atom, preferably fluorine; and
t is the valent number of the metal, for example 6 in the case of antimony.

Preferred cationic photoinitiators include sulfonium salts (e.g., triarylsulfonium hexafluoroantimonate salts), iodonium photoinitiators, e.g. iodonium tetrakis(pentafluorophenyl)borate, because they tend to be less yellowing, especially when used in combination with photosensitizers such as, for instance, n-ethyl carbazole.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904, which is hereby incorporated in its entirety by reference. Other preferred sensitizers are benzoperylene, 1,8-diphenyl-1,3,5,7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation.

The present composition comprises, relative to the total weight of the composition, from about 0.1 wt % to about 15 wt % of one or more cationic photoinitiators. In one embodiment, the present composition comprises, relative to the total weight of the composition, from about 0.2 wt % to about 10 wt % of one or more cationic photoinitiators, relative to the total weight of the composition. In another embodiment, the present composition comprises, relative to the total weight of the composition, from about 0.5 wt % to about 6 wt % of one or more cationic photoinitiators, relative to the total weight of the composition.

The composition of the present invention also comprises one or more additives. These additives can be stabilizers such as light stabilizers and thermal stabilizers, antioxidants, dyes, pigments, fluorescent whitening agents, UV absorbers, photosensitizers, antifoaming agents, air release agents, wetting agents, flow control agents, surfactants, and/or leveling agents. Some of the additives are described below as examples.

Stabilizers useful in resin compositions for stereolithography are known to people of ordinary skill in the art. Suitable stabilizers for the composition of the present invention include those for improving storage and in-use viscosity stability, color stability, thermal stability or ageing stability of the liquid resin or fabricated three-dimensional articles. Such materials include cyclic amides, hindered amines, hindered phenols, phosphites, sulfides, and salts of metals of Group IA and weak inorganic acids. Examples of stabilizers include polyvinylpyrolidone, benzyl-N,N-dialkylamine, Longnox-10, rubidium carbonate.

Dyes and pigments useful in resins compositions for stereolithography are known to people of ordinary skill in the art. Suitable dyes or pigments in the effective amount for the desired color effect for the composition of the present invention include titanium dioxide white dispersion, carbon black dispersion, various organic or inorganic pigments, dyes, latent dyes like Copikem dyes.

Antifoaming agents useful in resin compositions for stereolithography are known to people of ordinary skill in the art. Suitable commercially available antifoaming agents for the composition of the present invention include BYK-A-501, BYK A 320, BYK A 506, Foam Blast 20F, SAG-47, PolyFox PF 656.

Leveling agents useful in resin compositions for stereolithography are known to people of ordinary skill in the art. Suitable leveling agents for the composition of the present invention include polyoxyalkylene siloxanes and silicones such as SILWET L-7600, polyoxyethylene trimethylnonyl ether such as Tergitol TMN 6.

Each additive is present in the composition with an amount from about 0.001 wt % to about 5 wt %, relative to the total weight of the composition. In one embodiment, each additive is present in the composition with an amount from about 0.002 wt % to about 2 wt %, relative to the total weight of the composition. In another embodiment, each additive is present in the composition with an amount from about 0.003 wt % to about 0.5 wt %, relative to the total weight of the composition.

The total wt % of the additives used in the composition of the present invention is from about 0.005 wt % to about 10 wt %, relative to the total weight of the composition. In another embodiment, the total wt % of these additives is from about 0.01 wt % to about 5 wt %, relative to the total weight of the composition.

Fillers can be added to the compositions to improve properties such as modulus, strength, heat resistance. The fillers can be metallic-, organic-, inorganic-, or organic-inorganic hybrid fillers (e.g. silica particles, glass beads, or talc). The size of the fillers may vary and can be, for instance, in the nanometer range or in the micrometer range.

In one embodiment, the present composition comprises, relative to the total weight of the composition, less than 20 wt % of fillers, e.g. less than 10 wt %, less than 5 wt %, or about 0 wt %. In another embodiment, the present compositions comprise, relative to the total weight of the composition, up to 70 wt % of filler, e.g. 20-70 wt %, 30-60 wt %, or 40-50 wt %.

Another embodiment of the present invention is a radiation-curable composition comprising:
  a. from about 50 wt % to about 60 wt % of a cycloaliphatic diepoxide;
  b. from about 10 wt % to about 15 wt % of a polytetramethylene glycol;
  c. from about 7 wt % to about 10 wt % of a monofunctional oxetane having a hydroxyl group;
  d. from about 10 wt % to about 20 wt % of an aromatic diacrylate;
  e. from about 2 wt % to about 6 wt % of a radical photoinitiator;
  f. from about 0.5 wt % to about 6 wt % of a cationic photoinitiator; and
  g. from about 0.003 wt % to about 0.5 wt % of a photosensitizes.

The individual elements of the embodiments of this invention described above are the same as those individual elements of the invention which have been previously described. As such, a description of such individual elements will not be repeated here.

EXAMPLES

The present invention is further illustrated with a number of examples, which should not be regarded as limiting the scope of the present invention.

Radiation curable liquid compositions were prepared by weighing all the ingredients into a container under mechanical stirring either at room temperature or up to 50° C. until homogeneous resin mixtures were obtained. Each liquid mixture was then filtered off into a vat of stereolithography apparatus using a medium paint filter before fabrication of parts.

Compositions were prepared by mixing the components listed in Table 2 (Examples) and Table 3 (Comparative Examples, which are not Examples of the invention) for epoxy and acrylate dual cure or hybrid resins, with amounts of the components being listed in parts by weight. The thus prepared compositions were subsequently analyzed in accordance with the Test Methods described below. The test results are also listed in Tables 2-3.

Test Methods (a) Energy E10, Depth of Penetration $D_p$, and Critical Energy $E_c$ The photo properties $E_c$ (mJ/cm$^2$), $D_p$ (μm), and E10 (mJ/cm$^2$) represent the photo response (in this case thickness of layer formed) of a particular formulation to exposure by a single wavelength or range of wavelengths. In the instant Examples and Comparative Examples, at least 20 grams of composition were poured into a 100 mm diameter petri-dish and allowed to equilibrate to approximately 30° C. and 30% RH. The samples were then scanned in a line-by-line fashion using a focused laser beam of approximately 80-140 mW. The laser, a frequency tripled YAG laser, had an output wavelength of 354.7 nm and was pulsed at 80 KHz. The exposures were made in a square pattern approximately 20 mm by 20 mm. Six individual exposures were made at near constant laser power but at various scan speeds. The parallel scan lines making up each exposure were drawn approximately 50 μm apart. Based upon knowledge of the diameter of the focused beam at the liquid surface, the scan speed, the laser power, and the scan spacing, the summation of exposure mJ/cm$^2$ was calculated. Each square was allowed to float on the surface of the petri-dish for approximately 15 minutes. Then the squares were blotted and a thickness measurement was taken using Mitutoyo NTO25-8"C spring loaded Absolute Digimatic calipers. When the natural log of the exposures is plotted against the measured thickness, a least squares fit line can be drawn. The $D_p$ (μM) is the slope of the least squares fit line. The $E_c$ (mJ/cm$^2$) is the X-axis crossing point (Y=0) of the line. The E10 is the energy necessary to produce a layer that was approximately 10 mils (254 μm) thick. In general, the lower the E10 number, the faster the photo speed of the composition. Similarly, the energy necessary to produce a layer of 12 mils (305 μm) or 13 mils (330 μm) was thus obtained.

(b) Tensile Strength, Young's Modulus, and Elongation at Break

Tensile data was obtained by testing tensile bars ("dogbones") made by first consecutively imaging 150 μm thick layers of the composition to be tested in a rapid prototyping machine. Each cross-sectional layer of the tensile bar was given an exposure, as specified in Tables 2 and 3, which was sufficient to polymerize the composition at a 250 μm to 325 μm depth, providing approximately 100 μm to 175 μm of overcure or engagement cure to assure adhesion to the previously coated and exposed layer. The layers were exposed with a laser emitting in the ultraviolet (UV) region at 354.7 nm. The resulting tensile bars/dogbones were approximately 150 mm long and had a cross-section in the narrowed portion of approximately 10 mm×4 mm. After preparation of the tensile bar in the rapid prototyping machine, the tensile bar was removed from the machine, washed with tri(propyleneglycol) methyl ether ("TPM") and isopropanol, dried in the air and placed in a post-curing apparatus ("PCA" sold by 3-D Systems, 10 bulb unit using Phillips TLK/05 40 W bulbs) for UV post-cure. In the PCA, the tensile bar was post-cured by subjecting it to 60 minutes of UV radiation at room temperature. Optionally, the tensile bar was further subjected to 80° C. thermal post-cure for two hours with ramps of 1° C./min from room temperature after the 60 minute UV post-cure in the PCA.

The tensile tests to determine tensile strength, Young's modulus, and elongation at break were run one week after preparation of the UV-post-cured tensile bar (unless otherwise specified in Tables 2 and 3). In the event the tensile bar is both UV and thermally post-cured, these tests were run 40 hours or more after the thermal post-cure. The tensile tests were conducted in accordance with ASTM D638, which is hereby incorporated in its entirety by reference, except that no provision was made for controlling the room temperature and humidity and the bars were not equilibrated for 2 days. The reported data is the average of three measurements.

In one embodiment, the tensile strength of the cured composition of the invention, measured 1 week after UV post-cure in a post-curing apparatus, is from about 40 MPa to about 75 MPa. In another embodiment, the tensile strength of the cured composition of the invention, measured 1 week after UV post-cure in a post-curing apparatus, is from about 50 MPa to about 70 MPa.

In one embodiment, the Young modulus of the cured composition of the invention, measured 1 week after UV post-cure in a post-curing apparatus, is from about 1500 MPa to about 4000 MPa. In another embodiment, the Young modulus of the composition of the invention, measured 1 week after UV post-cure in a post-curing apparatus, is from about 2000 MPa to about 3500 MPa.

In one embodiment, the tensile strength of the cured composition of the invention, measured at 40 hours or more after UV post-cure in a post-curing apparatus and thermal post-cure, is from about 50 MPa to about 80 MPa. In another embodiment, the tensile strength of the cured composition of the invention, measured at 40 hours or more after UV post-cure in a post-curing apparatus and thermal post-cure, is from about 60 MPa to about 70 MPa.

In one embodiment, the Young modulus of the cured composition of the invention, measured at 40 hours or more after UV post-cure in a post-curing apparatus and thermal post-cure, is from about 1500 MPa to about 4000 MPa. In another embodiment, the Young modulus of the composition of the invention, measured at 40 hours or more after UV post-cure in a post-curing apparatus and thermal post-cure, is from about 2000 MPa to about 3500 MPa.

(c) Glass Transition Temperature ($T_g$)

A UV post-cured and thermally post-cured specimen was prepared in the same manner as described above for the preparation of a tensile bar. Part of the specimen was placed in a TA Instruments TMA 2940 at room temperature. The specimen was then heated with a ramp of 3° C./min from room temperature or below up to 250° C. under a nitrogen purge of 60 mL/min. A graph of dimension change over temperature was generated and analyzed by using TA Instrument Universal Analysis V2.6D software, which calculated the glass transition temperature ($T_g$) from a sudden change in the slope of the thermal expansion curve.

The composition of the present invention, when cured, has a glass transition temperature of about 60° C. to about 120° C. In another embodiment, the composition of the present invention, when cured, has a glass transition temperature of about 70° C. to about 110° C.

(d) Heat Deflection Temperature (HDT)

Fully cured specimens for determining the HDT were prepared in the same manner as for the above tensile bars, except that the dimensions of the specimens for the HDT measurements were 5 inch (127 mm) in length and 0.5×0.5 inch (12.7 mm×12.7 mm) in cross-section. The HDT (under a pressure of 0.455 MPa or 66 psi) of the specimens was then determined according to ASTM D648-04 Method B, which is hereby incorporated in its entirety by reference, using an ATLAS HDV2 Automated instrument.

The composition of the present invention has a heat deflection temperature of about 50° C. to about 90° C.; and preferably from about 55° C. to about 85° C. after UV post-cure. After UV post-cure in a post-curing apparatus and thermal post-cure, the composition has a heat deflection temperature of about 70° C. to about 120° C.; and preferably, from about 75° C. to about 115° C.

(e) Flexural Strength and Flexural Modulus

Fully cured specimens for determining the flexural properties were prepared and conditioned in the same manner as for the above tensile bars, except that the dimensions of the specimens for determining the flexural properties were 10 mm×6 mm×125 mm (0.394"×0.236"×4.92"). The three point bending test was conducted in accordance with ASTM D790-03, which is hereby incorporated in its entirety by reference, except that no provision was made for controlling the room temperature and humidity and the bars were not equilibrated for 2 days. The reported data is the average of three measurements.

In one embodiment, the flexural strength of the cured composition of the invention, measured 1 week after UV post-cure in a post-curing apparatus, is from about 60 MPa to about 110 MPa. In another embodiment, the flexural strength of the cured composition of the invention, measured 1 week after UV post-cure in a post-curing apparatus, is from about 70 MPa to about 105 MPa.

In one embodiment, the flexural modulus of the cured composition of the invention, measured 1 week after UV post-cure in a post-curing apparatus, is from about 1500 MPa to about 3500 MPa. In another embodiment, the flexural modulus of the cured composition of the invention, measured 1 week after UV post-cure in a post-curing apparatus, is from about 2000 MPa to about 3000 MPa.

In one embodiment, the flexural strength of the cured composition of the invention, measured at 40 hours or more after UV post-cure in a post-curing apparatus and thermal post-cure, is from about 65 MPa to about 120 MPa. In another embodiment, the flexural strength of the cured composition of the invention, measured at 40 hours or more after UV post-cure in a post-curing apparatus and thermal post-cure, is from about 75 MPa to about 110 MPa.

In one embodiment, the flexural modulus of the cured composition of the invention, measured at 40 hours or more after UV post-cure in a post-curing apparatus and thermal post-cure, is from about 1500 MPa to about 3500 MPa. In another embodiment, the flexural modulus of the cured composition of the invention, measured at 40 hours or more after UV post-cure in a post-curing apparatus and thermal post-cure, is from about 2000 MPa to about 3000 MPa.

(f) Notched Izod Impact Strength

Fully cured specimens for determining notched Izod impact strength were prepared in the same manner as for the above tensile bars, except that the specimen size was 12.7 mm×6.35 mm×63.5 mm (0.50"×0.25"×2.5"). Specimens were left at ambient conditions for at least one day after UV or UV plus thermal post-cure as described above for the preparation of the tensile bars before notching. Specimens were notched according to ASTM D-256A using a CS-93M Sample Notcher from CSI. The notched samples were placed in an environment controlled at 50% RH and 20-23° C. for two days. Specimens were removed from the controlled environment immediately prior to testing. Izod Impact values were measured with a Zwick model 5110 impact tester fitted with a 2.75 J pendulum. The reported data is the average of five measurements.

In one embodiment, the cured composition of the present invention has a notched Izod impact strength from about 0.1 J/cm to about 0.5 J/cm. In another embodiment, the cured composition of the present invention has a notched Izod impact strength from about 0.15 J/cm to about 0.45 J/cm.

TABLE 1

Commercial name, supplier and description

| Commercial Name (Supplier) | Description |
| --- | --- |
| Ebecryl 3700 (UCB Chemicals) | bisphenol A diglycidyl ether diacrylate |
| SR-399 (Sartomer) | monohydroxy dipentaerythritol pentaacrylate |
| SR 368 (Sartomer) | tris(2-hydroxy ethyl) isocyanurate triacrylate |
| DPHA (Sartomer) | dipentaerythritol hexaacrylate |
| Chivacure-1176 (Chitec) | mixture of triarysulfonium hexafluoroantimonate salts |
| IRGACURE 184 (Ciba Geigy) | 1-hydroxycyclohexyl phenyl ketone |
| PVP (Aldrich) | stabilizer (polyvinylpyrolidone, Mw ca. 10,000) |
| Longnox 10 (Longchem C&S International) | tetrakis(methylene-3(3',5'-de-t-butyl-4'-hydroxyphenyl)proprionate)methane |
| SILWET L-7600 (OSI Specialities) | polyalkyleneoxide modified polydimethylsiloxane |
| BYK-A-501 (BYK-Chemie) | silicone-free solution of foam destroying polymers |
| White dispersion (Chroma Injecta Color Systems) | titanium dioxide white pigment dispersion |
| Albidur EP 2240 (Hanse Chemie) | silicone rubber-modified bisphenol A epoxy resin |
| Albidur EP 5340 (Hanse Chemie) | silicone rubber-modified cycloaliphatic epoxy resin |
| Albidur PU 5640 (Hanse Chemie) | silicone rubber-modified glycerol poly(oxypropylene)triol resin |
| Terathane-1000 (Invista) | poly(tetramethylene oxide) glycol |
| Terathane 250 (Invista) | poly(tetramethylene oxide) glycol |
| CHDM (Eastman Chemical) | 1,4-cyclohexanedimethanol |
| Cyracure UVR-6105 (Dow Chemical) | 3,4-epoxy cyclohexyl methyl-3,4-epoxy cyclohexyl carboxylate (aliphatic epoxy) |
| Heloxy 48 (Resolution Performance Products) | Trimethylolpropane triglycidyl ether |
| Heloxy 107 (Resolution Performance Products) | cyclohexanedimethanol diglycidyl ether |
| EPON 825 (Resolution Performance Products) | bisphenol A diglycidyl ether (aromatic epoxy) |
| OXT-101 (Toagosei) | 3-ethyl-3-hydroxymethyl-oxetane (oxetane) |
| Nanopox 22/0765 (Hanse Chemie) | 50% silica nanoparticles in 3-ethyl-3-hydroxymethyl-oxetane |

TABLE 2

| | Examples | | | |
| --- | --- | --- | --- | --- |
| | 1 % by wt | 2 % by wt | 3 % by wt | 4 % by wt |
| Ingredient | | | | |
| Ebecryl 3700 | 18.019 | 14.237 | 15.360 | 15.334 |
| Chivacure-1176 | 4.498 | 4.000 | 4.000 | 4.000 |
| Irgacure-184 | 2.000 | 2.500 | 2.800 | 2.500 |
| PVP | 0.003 | 0.005 | 0.005 | 0.005 |
| Albidur EP 2240 | 1.893 | | | |
| Albidur 5340 | | 3.000 | | 3.000 |
| Terathane-1000 | 9.463 | 13.991 | 11.000 | 10.972 |
| BYK A501 | 0.013 | 0.020 | 0.020 | 0.020 |
| Cyracure UVR-6105 | 56.987 | 55.000 | 57.585 | 54.911 |
| Silwet L7600 | 0.126 | 0.200 | 0.200 | 0.200 |
| White dispersion | | | 0.100 | |
| OXT-101 | 6.998 | 7.047 | 8.930 | 9.058 |
| Total | 100.000 | 100.000 | 100.000 | 100.000 |

TABLE 2-continued

|  | Examples | | | |
|---|---|---|---|---|
|  | 1 % by wt | 2 % by wt | 3 % by wt | 4 % by wt |
| Photo Speed | | | | |
| $E_c$ (mJ/cm$^2$) | 6.34 | 9.04 | 5.99 | 11.47 |
| $D_p$ (μm) | 142 | 145 | 131 | 161 |
| $E_{10}$ (mJ/cm$^2$) | 37.9 | 52.2 | 41.7 | 55.4 |
| Exposure energy used for each 152-μm layer (mJ/cm$^2$) | 65 (E13) | 52 (E10) | 42 (E10) | 55 (E10) |
| Tensile properties 1 week after UV post-cure in PCA | | | | |
| Young's Modulus (MPa) | 2931 | 2662 | 2724 | 2690 |
| Tensile Strength (MPa) | 62.1 | 56.6 | 59.3 | 57.9 |
| Tensile Elongation (%) | 4.0 | 8.9 | 5.5 | 7.1 |
| Tensile properties 40 hours or more after UV post-cure in PCA and thermal post-cure at 80° C./2 hrs | | | | |
| Young's Modulus (MPa) | 2662 | 2648 | 2772 | 2552 |
| Tensile Strength (MPa) | 67.6 | 64.1 | 65.5 | 62.8 |
| Tensile Elongation (%) | 5.2 | 7.0 | 6.1 | 6.6 |
| Flexural properties 1 week after UV post-cure in PCA | | | | |
| Flexural Modulus (MPa) | 2697 | 2434 | 2579 | 2545 |
| Flexural Strength (MPa) | 93.8 | 84.8 | 86.9 | 85.5 |
| Flexural properties 40 hours or more after UV post-cure in PCA and thermal post-cure at 80° C./2 hrs | | | | |
| Flexural Modulus (MPa) | 2614 | 2386 | 2538 | 2455 |
| Flexural Strength (MPa) | 98.6 | 89.0 | 90.3 | 87.6 |
| Tg (° C.) | | | | |
| 40 hours or more after UV post-cure in PCA and thermal post-cure at 80° C./2 hrs | 112 | | | |
| HDT at 0.455 MPa (° C.) | | | | |
| 1 week after UV post-cure in PCA | | 72 | | |
| 40 hours or more after UV post-cure in PCA and thermal post-cure at 80° C./2 hrs | | 94 | | |
| Izod Impact Strength (J/cm) | | | | |
| 1 week after UV post-cure in PCA | 0.25 | 0.33 | 0.15 | 0.17 |
| 40 hours or more after UV post-cure in PCA and thermal post-cure at 80° C./2 hrs | 0.23 | 0.29 | 0.16 | 0.18 |

TABLE 3

|  | Comparative Examples | | | | | |
|---|---|---|---|---|---|---|
|  | CE1 % by wt | CE2 % by wt | CE3 % by wt | CE4 % by wt | CE5 % by wt | CE6 % by wt |
| Ingredient | | | | | | |
| SR399 | 2.993 | 9.500 | | | | |
| SR 368 | 9.978 | | | | | |
| DPHA | | | | 11.839 | | 9.346 |
| Ebecryl 3700 | 0.000 | 0.000 | 17.969 | 0.000 | 15.275 | 0.000 |
| Chivacure-1176 | 4.989 | 2.832 | 4.941 | 5.300 | 4.000 | 4.700 |
| Irgacure-184 | 1.996 | 1.914 | 1.997 | 2.950 | 2.500 | 3.000 |
| PVP | 0.005 | 0.005 | 0.005 | 0.005 | 0.005 | 0.005 |
| Albidur EP 2240 | 2.993 | | 2.995 | | | |
| Albidur PU 5640 | | 24.653 | | | | |
| Albidur EP 5340 | | | | | 3.000 | |
| Terathane-1000 | 5.987 | 0.000 | 14.974 | 0.000 | 20.000 | 15.133 |
| Terathane 250 | | | | 12.722 | | |
| CHDM | 5.987 | | | | | |
| BYK A501 | 0.020 | 0.020 | 0.020 | 0.020 | 0.020 | 0.020 |
| Heloxy 48 | 7.982 | | | | | |
| Cyracure UVR6105 | 48.890 | 52.018 | 56.900 | 47.862 | 55.000 | 58.712 |
| Nanopox 22/0765 | | | | 19.106 | | |

TABLE 3-continued

| | Comparative Examples | | | | | |
|---|---|---|---|---|---|---|
| | CE1 % by wt | CE2 % by wt | CE3 % by wt | CE4 % by wt | CE5 % by wt | CE6 % by wt |
| OXT-101 | 0.000 | 0.000 | 0.000 | 0.000 | 0.000 | 8.884 |
| Heloxy 107 | 7.982 | | | | | |
| Silwet L7600 | 0.200 | 0.200 | 0.200 | 0.197 | 0.200 | 0.200 |
| Epon 825 | | 8.858 | | | | |
| Total | 100.000 | 100.000 | 100.000 | 100.000 | 100.000 | 100.000 |
| Photo Speed | | | | | | |
| $E_c$ (mJ/cm$^2$) | 4.69 | 6.98 | 6.29 | 7.16 | 8.87 | 5.98 |
| $D_p$ (μm) | 116 | 125 | 121 | 151 | 149 | 144 |
| $E_{10}$ (mJ/cm$^2$) | 41.9 | 53.5 | 50.9 | 38.3 | 49.0 | 35.1 |
| Exposure energy used for each 152-μm layer (mJ/cm$^2$) | 81 (E13) | 53 (E10) | 95 (E13) | 38 (E10) | 69 (E12) | 50 (E12) |
| Tensile properties 1 week after UV post-cure in PCA | | | | One day | | |
| Young's Modulus (MPa) | 2924 | 2290 | 2607 | 2848 | 2041 | 2517 |
| Tensile Strength (MPa) | 65.3 | 43.4 | 54.5 | 53.1 | 42.8 | 52.4 |
| Tensile Elongation (%) | 6.1 | 3.6 | 7.6 | 8.0 | 21.7 | 10.2 |
| Tensile properties a 40 hours or more after UV post-cure in PCA and thermal post-cure at 80° C./2 hrs | | | | | | |
| Young's Modulus (MPa) | 2621 | | 2421 | | 1786 | 2290 |
| Tensile Strength (MPa) | 64.9 | | 52.6 | | 40.7 | 51.7 |
| Tensile Elongation (%) | 5.3 | | 6.2 | | 13.8 | 7.7 |
| Flexural properties 1 week after UV post-cure in PCA | | | | One day | | |
| Flexural Modulus (MPa) | | 2386 | 2407 | 2159 | 1731 | 2290 |
| Flexural Strength (MPa) | | 69.7 | 83.4 | 71.0 | 60.0 | 75.2 |
| Flexural properties 40 hours or more after UV post-cure and thermal post-cure at 80° C./2 hrs | | | | | | |
| Flexural Modulus (MPa) | | 2497 | 2114 | | 1566 | 2152 |
| Flexural Strength (MPa) | | 83.4 | 75.9 | | 54.5 | 74.5 |
| Tg (° C.) | | | | | | |
| 40 hours or more after UV post-cure in PCA and thermal post-cure at 80° C./2 hrs | 84 | | 97 | | | |
| HDT at 0.455 MPa (° C.) | | | | | | |
| 1 week after UV post-cure in PCA | | | 83 | | | |
| 40 hours or more after UV post-cure in PCA and thermal post-cure at 80° C./2 hrs | | | 89 | | | |
| Izod Impact Strength (J/cm) | | | | | | |
| 1 week after UV post-cure in PCA | | | 0.24 | | 0.40 | 0.18 |
| 40 hours or more after UV post-cure in PCA and thermal post-cure at 80° C./2 hrs | | | 0.19 | | 0.28 | 0.14 |

While the invention has been described in detail and with reference to specific embodiments thereof, it will be apparent to one of ordinary skill in the art that various changes and modifications can be made therein without departing from the spirit and scope of the claimed invention.

The invention claimed is:

1. A radiation curable composition comprising:
 a. from about 50 wt % to about 70 wt % of a cycloaliphatic diepoxide;
 b. from about 5 wt % to about 15 wt % of a polyol;
 c. from about 5 wt % to about 15 wt % of a monofunctional oxetane having an OH group;
 d. from about 10 wt % to about 20 wt % of an aromatic diacrylate selected from the group consisting of a bisphenol A-based diacrylate, a bisphenol S-based diacrylate, and a bisphenol F-based diacrylate;
 e. a radical photoinitiator; and
 f. a cationic photoinitiator;
 wherein the tensile strength of the cured composition, measured 1 week after UV post-cure in a post-curing apparatus, is from about 40 MPa to about 75 MPa;
 and said radiation curable composition contains greater than 0.10 equivalents of hydroxyl groups per 100 grams of said composition.

2. The radiation curable composition according to claim 1, wherein the composition comprises
 a. from about 50 wt % to about 60 wt % of a cycloaliphatic diepoxide;

b. from about 10 wt % to about 15 wt % of a polyol;
c. from about 7 wt % to about 10 wt % of a mono functional oxetane having an OH group; and
d. from about 10 wt % to about 20 wt % of an aromatic diacrylate selected from the group consisting of a bisphenol A-based diacrylate, a bisphenol S-based diacrylate, and a bisphenol F-based diacrylate.

3. The radiation curable composition according to claim 1, wherein the cycloaliphatic diepoxide is chosen from the group consisting of 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylene bis(3,4-epoxycyclohexanecarboxylate), ethanediol di(3,4-epoxycyclohexylmethyl) ether, 2-(3,4-epoxycyclohexyl-5,5-spiro-3,4-epoxy)cyclohexane-1,3-dioxane, and combinations thereof.

4. The radiation curable composition according to claim 1, wherein the polyol is an aliphatic diol selected from polyoxyethylene, polyoxypropylene or polytetramethylene glycol of number average molecular weight from about 600 to about 2000.

5. A radiation curable composition comprising:
a. from about 50 wt % to about 60 wt % of a cycloaliphatic diepoxide;
b. from about 10 wt % to about 15 wt % of a polytetramethylene glycol;
c. from about 7 wt % to about 10 wt % of a mono functional oxetane having a hydroxyl group;
d. from about 10 wt % to about 20 wt % of an aromatic diacrylate selected from the group consisting of a bisphenol A-based diacrylate, a bisphenol S-based diacrylate, and a bisphenol F-based diacrylate;
e. from about 2 wt % to about 6 wt % of a radical photoinitiator;
f. from about 0.5 wt % to about 6 wt % of a cationic photoinitiator; and
g. from about 0.003 wt % to about 0.5 wt % of a photosensitizer;

wherein said radiation curable composition contains greater than 0.10 equivalents of hydroxyl groups per 100 grams of said composition.

6. The composition according to claim 1, wherein the tensile strength of the cured composition of the invention, measured at 40 hours or more after UV post-cure in a post-curing apparatus and thermal post-cure, is from about 50 MPa to about 80 MPa.

7. The composition according to claim 1, wherein the Young's Modulus of the cured composition of the invention, measured 1 week after UV post-cure in a post-curing apparatus, is from about 1500 MPa to about 4000 MPa.

8. The composition according to claim 1, wherein the Young's Modulus of the cured composition of the invention, measured at 40 hours or more after UV post-cure in a post-curing apparatus and thermal post-cure, is from about 1500 MPa to about 4000 MPa.

9. The composition according to claim 1, wherein said composition, when cured, has a glass transition temperature of about 60° C. to about 120° C.

10. The composition according to claim 1, wherein said composition has a notched Izod impact strength of about 0.1 J/cm to about 0.5 J/cm.

11. A process for making a three-dimensional article comprising the steps of:
(1) providing a radiation curable composition comprising from about 50 wt % to about 70 wt % of a cycloaliphatic diepoxide; from about 5 wt % to about 15 wt % of a polyol; from about 5 wt % to about 15 wt % of a mono functional oxetane having an OH group; from about 10 wt % to about 20 wt % of an aromatic diacrylate selected from the group consisting of a bisphenol A-based diacrylate, a bisphenol S-based diacrylate, and a bisphenol F-based diacrylate; a radical photoinitiator; and a cationic photoinitiator;
(2) coating a thin layer of the radiation curable composition onto a surface;
(3) exposing said thin layer imagewise to actinic radiation to form an imaged cross-section, wherein the radiation is of sufficient intensity and time to cause substantial curing of the thin layer in the exposed areas;
(4) coating a thin layer of the composition onto the previously exposed imaged cross-section;
(5) exposing said thin layer from step (4) imagewise to actinic radiation to form an additional imaged cross-section, wherein the radiation is of sufficient intensity and time to cause substantial curing of the thin layer in the exposed areas and to cause adhesion to the previously exposed imaged cross-section;
(6) repeating steps (4) and (5) a sufficient number of times in order to build up the three-dimensional article;
wherein said radiation curable composition contains greater than 0.10 equivalents of hydroxyl groups per 100 grams of said composition.

12. A three-dimensional article formed from the composition of claim 1.

13. A three-dimensional article made by a process comprising the steps of:
(1) providing a radiation curable composition;
(2) coating a thin layer of the radiation curable composition onto a surface;
(3) exposing said thin layer imagewise to actinic radiation to form an imaged cross-section, wherein the radiation is of sufficient intensity and time to cause substantial curing of the thin layer in the exposed areas;
(4) coating a thin layer of the composition onto the previously exposed imaged cross-section;
(5) exposing said thin layer from step (4) imagewise to actinic radiation to form an additional imaged cross-section, wherein the radiation is of sufficient intensity and time to cause substantial curing of the thin layer in the exposed areas and to cause adhesion to the previously exposed imaged cross-section;
(6) repeating steps (4) and (5) a sufficient number of times in order to build up the three-dimensional article;
wherein said three-dimensional article, prior to the substantial curing in the exposing step, contains from about 50 wt % to about 70 wt % of a cycloaliphatic diepoxide; from about 5 wt % to about 15 wt % of a polyol; from about 5 wt % to about 15 wt % of a monofunctional oxetane having an OH group; from about 10 wt % to about 20 wt % of an aromatic diacrylate selected from the group consisting of a bisphenol A-based diacrylate, a bisphenol S-based diacrylate, and a bisphenol F-based diacrylate; a radical photoinitiator; and a cationic photoinitiator; and further possesses greater than 0.10 equivalents of hydroxyl groups per 100 grams of said composition.

14. The radiation curable composition according to claim 1, wherein the radiation curable composition has a heat deflection temperature of between about 50° C. to about 90° C. after UV post-cure.

15. The radiation curable composition according to claim 1, wherein the radiation curable composition has a heat deflection temperature of between about 55° C. to about 85° C. after UV post-cure.

16. The radiation curable composition according to claim 1, wherein the radiation curable composition has a heat deflection temperature of between about 70° C. to about 120° C. after UV post-cure and thermal post-cure.

17. The radiation curable composition according to claim 1, wherein the radiation curable composition has a heat deflection temperature of between about 75° C. to about 115° C. after UV post-cure and thermal post-cure.

18. The radiation curable composition according to claim 4, wherein said radiation curable composition contains at least 0.16 equivalents of hydroxyl groups per 100 grams of said composition.

19. The radiation curable composition according to claim 18, wherein said radiation curable composition further comprises a dye or pigment.

20. The radiation curable composition according to claim 19, wherein said dye or pigment is selected from the group consisting of a titanium dioxide white dispersion and a carbon black dispersion.

* * * * *